United States Patent [19]

Liao

[11] Patent Number: 5,546,019

[45] Date of Patent: Aug. 13, 1996

[54] CMOS I/O CIRCUIT WITH 3.3 VOLT OUTPUT AND TOLERANCE OF 5 VOLT INPUT

[75] Inventor: Hung-jen Liao, Toulu, Taiwan

[73] Assignee: Taiwan Semiconductor Manufacture Company, Hsinchu, Taiwan

[21] Appl. No.: 518,700

[22] Filed: Aug. 24, 1995

[51] Int. Cl.⁶ .............................................. H03R 19/0185
[52] U.S. Cl. .................................................. 326/81; 326/21
[58] Field of Search .................................. 326/9, 21, 31, 326/34, 80–81, 87

[56] References Cited

U.S. PATENT DOCUMENTS

| | | | |
|---|---|---|---|
| 4,565,932 | 1/1986 | Kuo et al. | 326/81 X |
| 4,782,250 | 11/1988 | Adams et al. | 307/473 |
| 4,963,766 | 10/1990 | Lundberg | 307/451 |
| 5,300,835 | 4/1994 | Assar et al. | 307/475 |
| 5,381,059 | 1/1995 | Douglas | 326/58 |
| 5,381,062 | 1/1995 | Morris | 326/21 X |
| 5,396,128 | 3/1995 | Dunning et al. | 326/68 |
| 5,444,397 | 8/1995 | Wong et al. | 326/81 |
| 5,450,025 | 9/1995 | Shay | 326/81 |
| 5,451,889 | 9/1995 | Heim et al. | 326/81 |
| 5,488,326 | 1/1996 | Shiraishi et al. | 326/81 X |
| 5,495,185 | 2/1996 | Goto | 326/9 X |

*Primary Examiner*—David R. Hudspeth
*Attorney, Agent, or Firm*—George O. Saile; Larry J. Prescott

[57] ABSTRACT

As VLSI chip design migrates from 5 volt designs to lower voltage designs, such as 3.3 volts, interfacing components with different power supplies is an unavoidable issue. This invention provides simple and inexpensive circuits which provide full rail to rail output voltage swing and prevent the PN junctions in the isolation wells of metal oxide semiconductor field effect transistors from becoming forward biased. This prevents excessive leakage currents and component damage which can occur when PN junctions in the isolation wells of PMOS field effect transistors become forward biased.

16 Claims, 4 Drawing Sheets

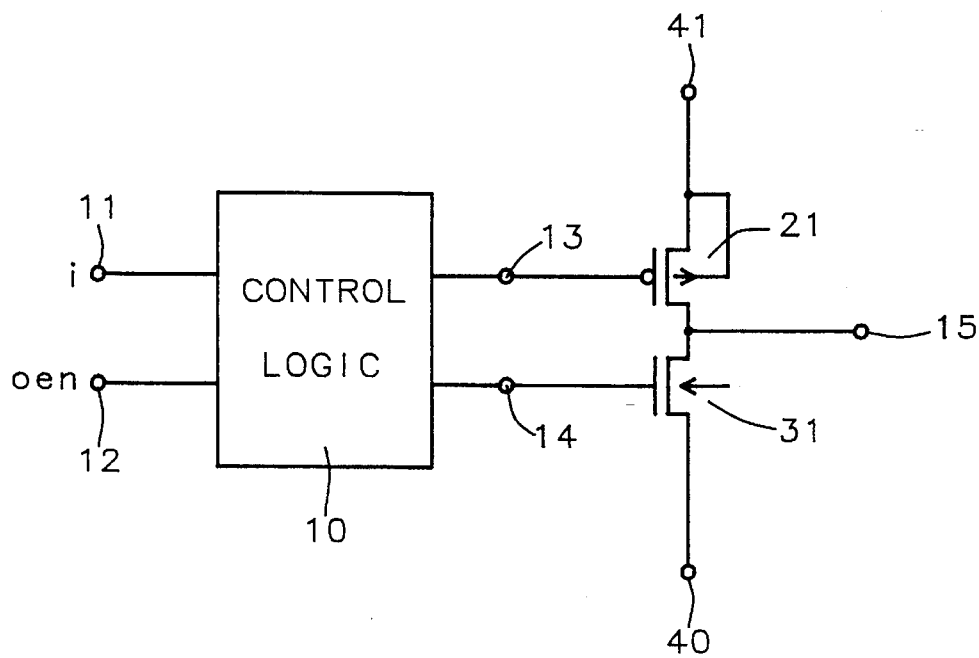
FIG. 1 – Prior Art
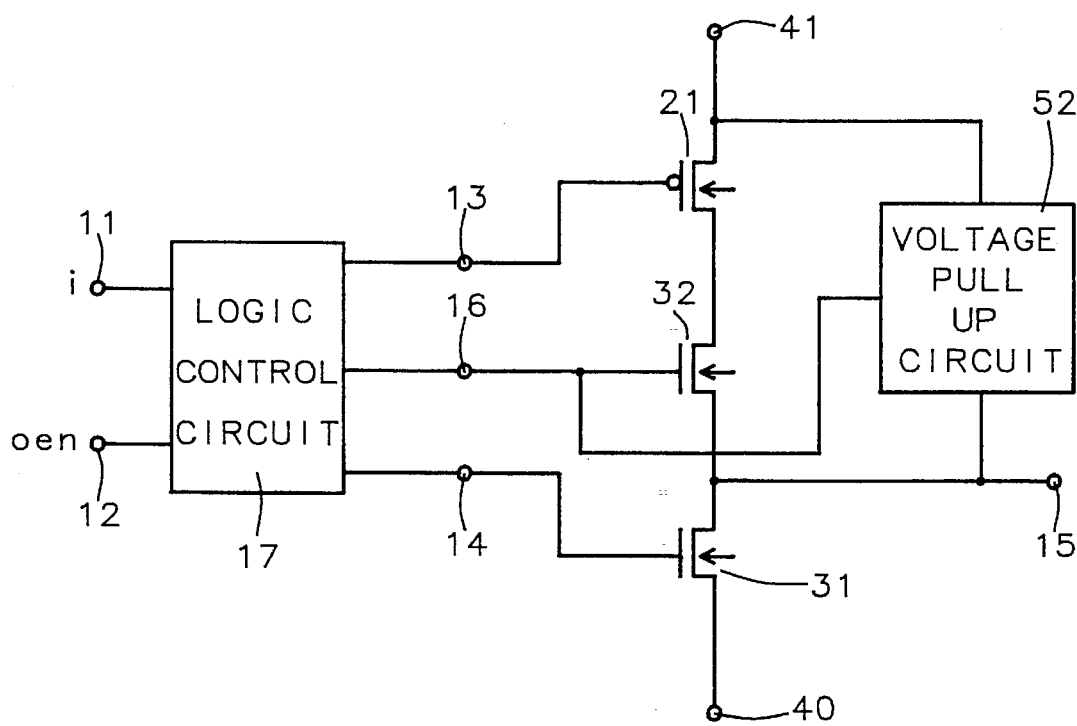
FIG. 2

CM OS I/O CIRCUIT WITH 3.3 VOLT OUTPUT AND TOLERANCE OF 5 VOLT INPUT

BACKGROUND OF THE INVENTION

(1) FIELD OF THE INVENTION

The invention provides a solution to the problem of interfacing CMOS circuits using 3.3 volt power supplies with circuits using 5.0 volt power supplies. The invention provides a simple circuit to provide full rail to rail output voltage swing and prevent the PN junctions in the isolation wells of metal oxide semiconductor field effect transistors from becoming forward biased.

(2) DESCRIPTION OF RELATED ART

As VLSI chip design migrates from 5 volt designs to lower voltage designs, such as 3.3 volts, interfacing components with different power supplies is an unavoidable issue. U.S. Pat. No. 4,782,250 to Adams et al, U.S. Pat. No. 4,963,766 to Lundberg, U.S. Pat. No. 5,300,835 to Assar et al, U.S. Pat. No. 5,381,059 to Douglas, and U.S. Pat. No. 5,396,128 to Dunning et al all address the problem of interfacing a CMOS output buffer with higher voltage external circuits. However, these inventions offer solutions having more complex circuit designs than the circuits of this invention.

This invention provides a solution to the problem of interfacing with higher voltage external circuits which uses simple and inexpensive circuits.

SUMMARY OF THE INVENTION

As VLSI, or very large scale integration, chip design migrates from higher voltage levels, for example about 5.0 volts to lower voltage levels, for example about 3.3 volts, it becomes necessary to interface components operating at higher voltage levels with components at lower voltage levels. When components operating at higher voltage levels interface with components operating at lower voltage levels there is a possibility of large leakage currents because the isolation junction in the isolation well of channel metal oxide semiconductor field effect transistors can become forward biased.

FIG. 1 shows a diagram of a conventional CMOS, or complimentary metal oxide semiconductor, field effect transistor output buffer circuit connected to a control logic circuit 10 for a tristate control circuit.

When the voltage at the second output node 14 of the control logic circuit is high, a logical one, the N channel metal oxide semiconductor, or NMOS, field effect transistor 31 is turned on and the output node 15 is connected to the reference voltage node 40 which is at ground potential. In this situation there is no leakage problem. However, when the voltage at the output voltage node 15 is driven above the voltage level at the first voltage supply node 41, $V_{DD}$, by circuitry operating at higher voltage levels, the PN junction of the isolation well in the P channel metal oxide semiconductor, or PMOS, field effect transistor 21 will become forward biased, excessive leakage current will flow from the output node 15 to the first voltage supply node 41, and possible component damage will result. In this example the voltage level at the first supply voltage node is about 3.3 volts and the voltage at the output node 15 can be about 5.0 volts. Circuitry developed to deal with this problem is complicated and expensive.

It is the objective of this invention to provide simple circuits which will prevent leakage current from flowing from the output node back to the first voltage supply node when the voltage at the output node is greater than the voltage at the first voltage supply node.

It is a further objective of this invention to provide the proper voltage at the output node when the first PMOS field effect transistor is turned on.

These objectives are achieved by adding a second NMOS field effect transistor 32 in series with the first NMOS field effect transistor 31 and the PMOS field effect transistor 21 between the PMOS field effect transistor 21 and the output node 15 and a voltage pull up circuit 52 between the output node and the first voltage supply node, as shown in FIG. 2. The second NMOS field effect transistor stops the leakage current through the PMOS field effect transistor when the voltage at the output node is larger than the voltage at the first voltage supply node. When the PMOS field effect transistor is turned on, the second NMOS field effect transistor 32 will turn off before the voltage at the output node reaches the voltage level at the first supply voltage node. The voltage pull up circuit 52 pulls the voltage at the output node 15 up to the voltage level at the first voltage supply node when the PMOS field effect transistor is turned on.

BRIEF DESCRIPTION OF THE DRAWINGS

FIG. 1 shows a diagram of a prior art CMOS output buffer circuit driven by a control logic circuit.

FIG. 2 shows a block diagram of a CMOS output buffer circuit with the leakage control and voltage pull up circuits of this invention.

DESCRIPTION OF THE PREFERRED EMBODIMENTS

Figure 3:
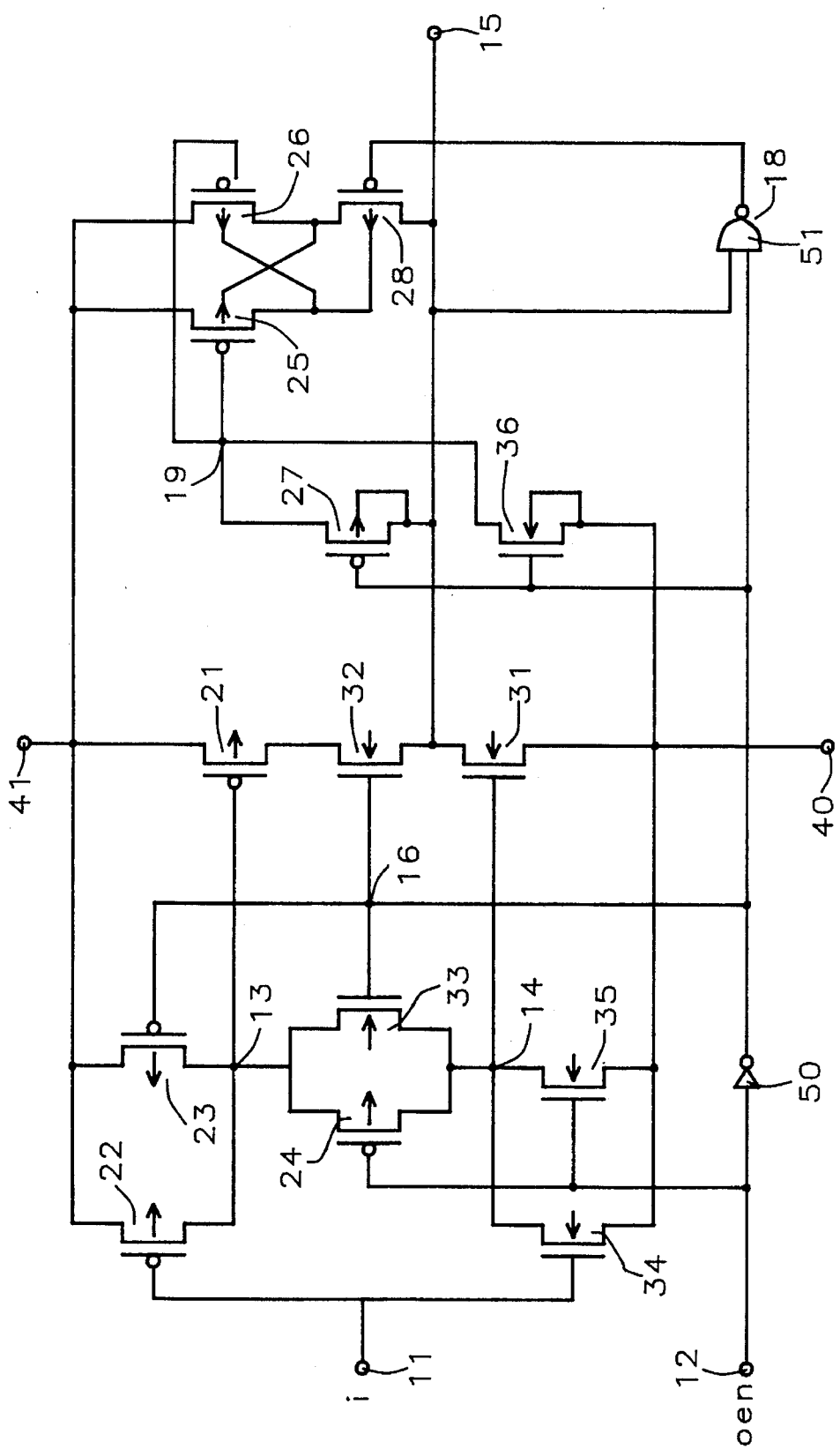
FIG. 3 shows a schematic diagram of the CMOS output buffer circuit, control logic circuit, current leakage control, and voltage pull up circuit of this invention.

Refer now to FIGS. 2 and 3 there is shown an embodiment of the CMOS output buffer circuit with a 3.3 volt output and tolerance of a 5 volt output interface. FIG. 2 shows a block diagram 17 of a control logic circuit; the output buffer circuit comprising a first PMOS field effect transistor 21, a first NMOS field effect transistor 31, and a second NMOS field effect transistor 32; and the voltage pull up circuit 52. A schematic diagram of the output buffer circuit with a 3.3 volt output and tolerance of a 5 volt interface is shown in FIG. 3.

The control logic circuit has a logic control input 11, a tristate control input 12, a first output 13, a second output 14, and a third output 16. As shown in FIG. 3, the control logic circuit comprises an inverter 50, a sixth PMOS field effect transistor 22, a seventh PMOS field effect transistor 23, an eighth PMOS field effect transistor 24, a fourth NMOS field effect transistor 33, a fifth NMOS field effect transistor 34, and a sixth NMOS field effect transistor 35. The first output 13 of the logic control circuit is connected to the gate of the first PMOS field effect transistor 21 of the buffer output circuit. The second output 14 of the logic control circuit is connected to the gate of the first NMOS field effect transistor 31 of the buffer output circuit. The third output 16 of the logic control circuit is the inverse of the signal at the tristate control input and is connected to the second NMOS field effect transistor 32 of the buffer output circuit.

The signal at the first output 13 of the logic control circuit will be a logical one when the signal at the logic control input 11 is a logical zero or the signal at the tristate control input 12 is a logical one, and a logical zero when the signal at the logic control input 11 is a logical one and the signal at the tristate control input 12 is a logical zero. The signal at the second output 13 of the logic control circuit will be a logical zero when the signal at the logic control input 11 is a logical one or the signal at the tristate control input 12 is a logical one, and a logical one when the signal at the logic control input 11 is a logical zero and the signal at the tristate control input 12 is a logical zero. The signal at the third output 16 of the logic control circuit is the inverse of the signal at the tristate control input.

As shown in FIG. 3 the first PMOS 21, the second NMOS 32, and the first NMOS 31 field effect transistors are connected in series between the first voltage supply node 41, which is supplied with a voltage of about 3.3 volts, and the reference voltage node 40, which is connected to ground potential. The output voltage node 15 is connected between the second NMOS field effect transistor 32 and the first NMOS field effect transistor 31. The output voltage node 15 is connected to external circuitry and the voltage at the output node 15 cam be driven as high as 5 volts.

Figure 4:
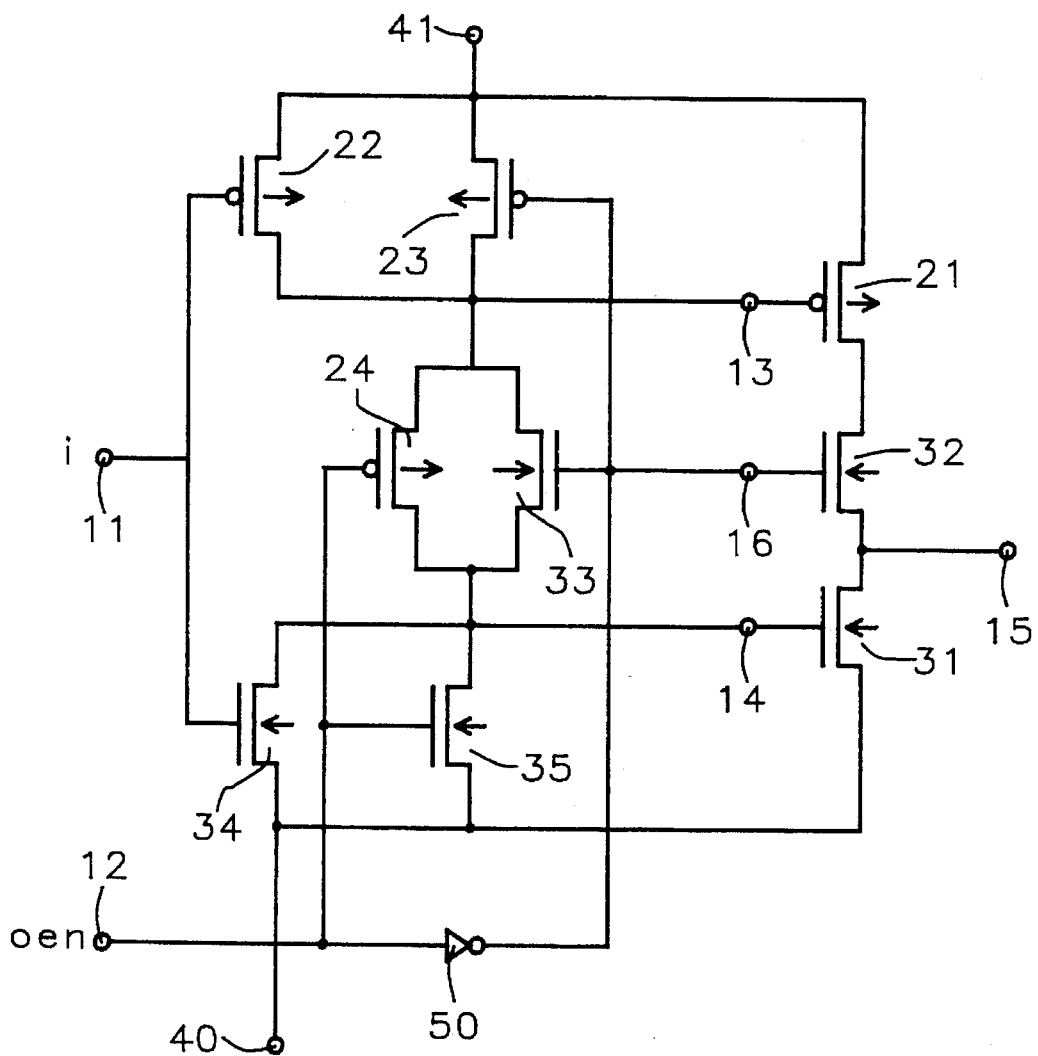
FIG. 4 shows a schematic diagram of the CMOS output buffer circuit, leakage current control, and control logic circuit of this invention.

Refer now to FIGS. 3 and 4. When the voltage at the tristate control input 12 of the logic control circuit is high, a logical one, the voltage at the first output 13 of the logic control circuit is high, a logical one, the voltage at the second output 14 of the logic control circuit is low, a logical zero, and the voltage at the third output 16 of the logic control circuit is low, a logical zero. In this case the first PMOS 21, the first NMOS 31, and the second NMOS 32 field effect transistors are turned off and the output buffer circuit is in the high impedance state. If the voltage at the output node 15 rises above the voltage at the first voltage supply node 41 the second NMOS field effect transistor 32 blocks any leakage current from flowing through the first PMOS field effect transistor 21 through the isolation well PN junction.

If the voltage at the tristate control input 12 of the logic control circuit is low, a logical zero, and the voltage at the logic control input 11 is low, a logical zero, the voltages at the first output 13, the second output 14, and the third output 16 of the logic control circuit are all high, a logical one. In this case the first PMOS field effect transistor 21 is turned off, the first NMOS field effect transistor 31 is turned on, and the second NMOS field effect transistor 32 is turned on and the voltage at the output node 15 is pulled down to the voltage at the reference voltage supply node 40, in this example ground potential. In this case there is no leakage problem.

If the voltage at the tristate control input 12 of the logic control circuit is low, a logical zero, and the voltage at the logic control input 11 is high, a logical one, the voltages at the first output 13 and the second output 14 of the logic control circuit are low, a logical zero, and the voltage at the third output 16 of the logic control circuit is high, a logical one. In this case the first PMOS field effect transistor 21 is turned on, the first NMOS field effect transistor 31 is turned off, and the second NMOS field effect transistor 32 is turned on and the voltage at the output node 15 begins to be pulled up to the voltage at the first voltage supply node 41, about 3.3 volts. As the voltage at the output node 15 rises to about 2.7 volts the second NMOS field effect transistor 32 will turn off an the voltage pull up circuit, reference number 52 in FIG. 2, is required to bring the voltage at the output node 15 up the level at the first voltage supply node 41, 3.3 volts.

Figure 5:
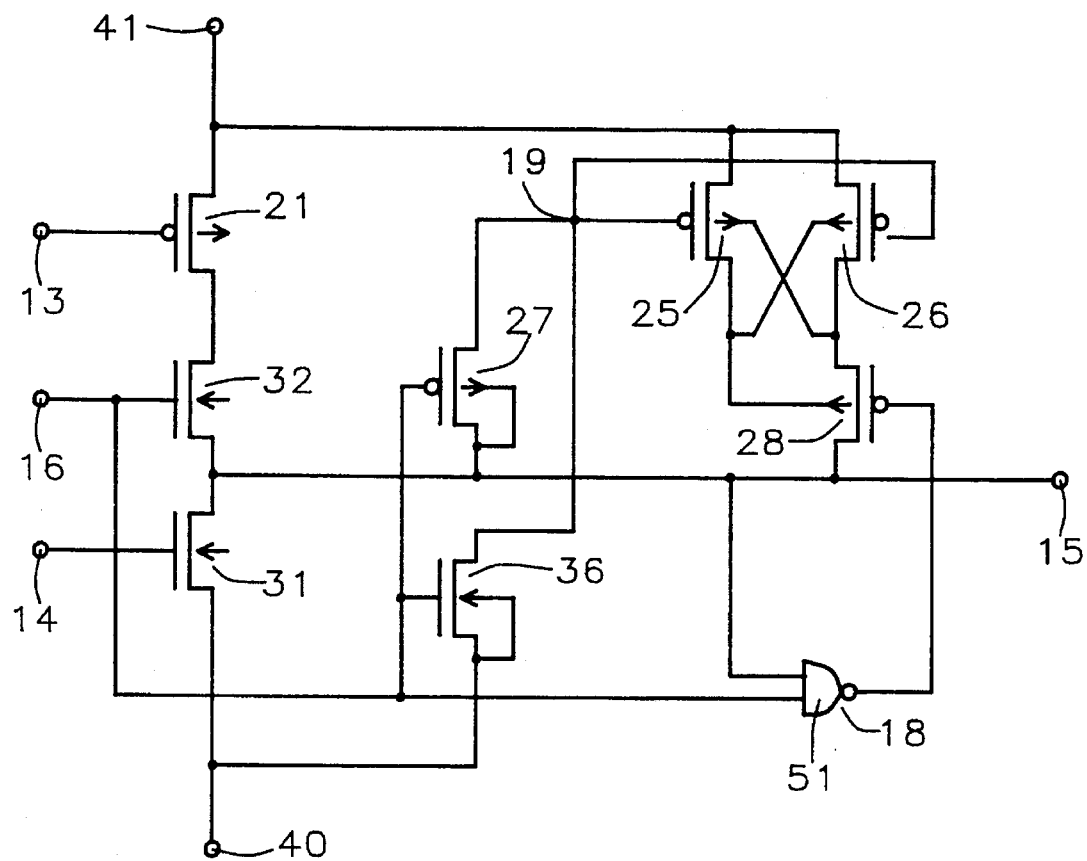
FIG. 5 shows a schematic diagram of the CMOS output buffer circuit, leakage current control, and voltage pull up circuit of this invention.

The voltage pull up circuit is shown in FIGS. 2 and 5. The voltage pull up circuit comprises an AND INVERT circuit 51, a second PMOS field effect transistor 28, a third PMOS field effect transistor 26, a fourth PMOS field effect transistor 25, a fifth PMOS field effect transistor 27, and a third NMOS field effect transistor 36. The inputs of the AND INVERT circuit 51 are connected to the output node 15 and to the third input 16 of the control logic circuit which is also connected to the gates of the third NMOS 36 and fifth PMOS 27 field effect transistors. The output of the AND INVERT circuit 51 is connected to the gate of the second PMOS field effect transistor 28. The gates of the third PMOS field effect transistor 26 and fourth PMOS field effect transistor 25 are connected to the drains of the fifth PMOS field effect transistor 27 and the third NMOS field effect transistor 36. The source of the second PMOS 28 and the source and isolation well of the fifth PMOS field effect transistors are connected to the output node 15. The source and isolation well of the third NMOS field effect transistor 36 are connected to the reference voltage node 40. The sources of the third PMOS 26 and fourth PMOS 25 field effect transistors are connected to the first voltage supply node 41. The isolation well of the third PMOS field effect transistor 26 is connected to the isolation well of the second PMOS 28 and the drain of the fourth PMOS 25 field effect transistors. The isolation well of the fourth PMOS field effect transistor 25 is connected to the drain of the third PMOS 26 and the source of the second PMOS 28 field effect transistors.

In the case for which the pull up circuit is required the voltage at the third output 16 of the control logic circuit is high, a logical one. This turns the third NMOS field effect transistor 36 on and the fifth PMOS field effect transistor 27 off. The gates of the third PMOS 26 and fourth PMOS 25 field effect transistors are pulled down to voltage at the reference voltage node 40 which turns the third PMOS 26 and fourth PMOS 25 field effect transistors on. The voltage at the output node 15 is increasing to about 2.7 volts so the output 18 of the AND INVERT circuit 51 will be low, a logical zero, the second PMOS field effect transistor 28 will be turned on the voltage at the output node 15 will be pulled up to the voltage at the first voltage supply node 41, 3.3 volts, through the second PMOS 28 and third PMOS 26 field effect transistors. In the high impedance state when the voltage at the output node 15 rises to a voltage level higher than the voltage at the first voltage supply node 41 the cross coupled connections of the isolation wells of the second PMOS 28, third PMOS 26, and fourth PMOS 25 field effect transistors prevent the PN junctions in the isolation wells of the second PMOS 28, third PMOS 26, and fourth PMOS 25 field effect transistors from becoming forward biased and leakage currents are prevented.

While the invention has been particularly shown and described with reference to the preferred embodiments thereof, it will be understood by those skilled in the art that various changes in form and details may be made without departing from the spirit and scope of the invention.

What is claimed is:

1. An output buffer circuit, comprising:

a first voltage supply node having a first voltage level;

a reference voltage supply node having a reference voltage level;

an output node having an output voltage level;

a logic control circuit having a tristate control input, a logic control input, a first output, a second output, and a third output;

a first P channel metal oxide semiconductor field effect transistor having a source, a drain, and a gate wherein said gate of said first P channel metal oxide semiconductor field effect transistor is connected to said first output of said logic control circuit and said source of said first P channel metal oxide semiconductor field effect transistor is connected to said first voltage supply node;

a first N channel metal oxide semiconductor field effect transistor having a source, a drain, and a gate wherein said gate of said first N channel metal oxide semiconductor field effect transistor is connected to said second output of said logic control circuit, said source of said first N channel metal oxide semiconductor field effect transistor is connected to said reference voltage supply node and said drain of said first N channel metal oxide semiconductor field effect transistor is connected to said output node;

means for preventing leakage current connected between said drain of said first P channel metal oxide semiconductor field effect transistor and said drain of said first N channel metal oxide semiconductor field effect transistor whereby leakage current flowing from said output node through said first P channel metal oxide semiconductor field effect transistor to said first voltage supply node is prevented; and means for output voltage pull up wherein the voltage at said output node is pulled up to said first voltage level when said first P channel metal oxide semiconductor field effect transistor is turned on.

2. The output buffer circuit of claim 1 wherein said means for preventing leakage current comprises a second N channel metal oxide semiconductor field effect transistor having a source, a drain, and a gate wherein said gate of said second N channel metal oxide semiconductor field effect transistor is connected to said third output of said logic control circuit, said drain of said second N channel metal oxide semiconductor field effect transistor is connected to said drain of said first P channel metal oxide semiconductor field effect transistor, and said source of said second N channel metal oxide semiconductor field effect transistor is connected to said drain of said first N channel metal oxide semiconductor field effect transistor.

3. The output buffer circuit of claim 1 wherein said means for voltage pull up comprises:

an AND INVERT circuit having a first input, a second input, and an output wherein said first input of said AND INVERT circuit is connected to said output node and said second input of said AND INVERT circuit is connected to said third input of said control logic circuit;

a second P channel metal oxide semiconductor field effect transistor having a source, a gate, a drain, and an isolation well wherein said gate of said second P channel metal oxide semiconductor field effect transistor is connected to said output of said AND INVERT circuit and said drain of said second P channel metal oxide semiconductor field effect transistor is connected to said output node;

a third P channel metal oxide semiconductor field effect transistor having a source, a gate, a drain, and an isolation well wherein said drain of said third P channel metal oxide semiconductor metal oxide semiconductor field effect transistor is connected to said source of said second P channel metal oxide semiconductor field effect transistor and said source of said third metal oxide semiconductor field effect transistor is connected to said first voltage supply node;

a fourth P channel metal oxide semiconductor field effect transistor having a source, a gate, a drain, and an isolation well wherein said source of said fourth metal oxide semiconductor field effect transistor is connected to said first voltage supply node, said drain of said fourth P channel metal oxide semiconductor field effect transistor is connected to said isolation well of said second P channel metal oxide semiconductor field effect transistor, and said isolation well of said fourth P channel metal oxide semiconductor field effect transistor is connected to said drain of said third P channel metal oxide semiconductor field effect transistor;

a fifth P channel metal oxide semiconductor field effect transistor having a source, a drain, a gate, and an isolation well wherein said drain of said fifth P channel metal oxide semiconductor field effect transistor is connected to said gate of said third P channel metal oxide semiconductor field effect transistor and the gate of said fourth P channel metal oxide semiconductor field effect transistor, said gate of said fifth P channel metal oxide semiconductor field effect transistor is connected to said third output of said logic control circuit, and said source and said isolation well of said fifth P channel metal oxide semiconductor field effect transistor are connected to said output node; and a third N channel metal oxide semiconductor field effect transistor having a source, a drain, a gate, and an isolation well wherein said drain of said third N channel metal oxide semiconductor field effect transistor is connected to said gate of said third P channel metal oxide semiconductor field effect transistor and the gate of said fourth P channel metal oxide semiconductor field effect transistor, said gate of said third N channel metal oxide semiconductor field effect transistor is connected to said third output of said logic control circuit, and said source and said isolation well of said third N channel metal oxide semiconductor field effect transistor are connected to said reference voltage node.

4. The output buffer circuit of claim 1 wherein said first voltage level is about 3.3 volts.

5. The output buffer circuit of claim 1 wherein said output voltage level is between about 0 and 5.0 volts.

6. The output buffer circuit of claim 1 wherein said reference voltage level is about zero volts.

7. The output buffer circuit of claim 1 wherein the signal at said third output of said control logic circuit is the inverse of the signal at said tristate control input of said control logic circuit.

8. The output buffer circuit of claim 1 wherein the signal at said first output of said control logic circuit is a logical one level when the signal at the logic control input of the logic control circuit is a logical zero level or the signal at the tristate control input is a logical one level and a logical zero level when the signal at the logic control input of the logic control circuit is a logical one level and the signal at the tristate control input is a logical zero level.

9. The output buffer circuit of claim 1 wherein the signal at said second output of said control logic circuit is a logical one level when the signal at the logic control input of the logic control circuit is a logical zero level and the signal at the tristate control input is a logical zero level and a logical zero level when the signal at the logic control input of the logic control circuit is a logical one level or the signal at the tristate control input is a logical one level.

10. The output buffer circuit of claim 1 wherein said control logic circuit further comprises:

a sixth P channel metal oxide semiconductor field effect transistor having a gate, a source, and a drain wherein said gate of said sixth P channel metal oxide semiconductor field effect transistor is connected to said logic control input of said control logic circuit, said source of said sixth P channel metal oxide semiconductor field effect transistor is connected to said first voltage supply node, and said drain of said sixth P channel metal oxide semiconductor field effect transistor is connected to said first output of said control logic circuit;

a seventh P channel metal oxide semiconductor field effect transistor having a gate, a source, and a drain wherein said gate of said seventh P channel metal oxide semiconductor field effect transistor is connected to said third output of said control logic circuit, said source of said seventh P channel metal oxide semiconductor field effect transistor is connected to said first voltage supply node, and said drain of said seventh P channel metal oxide semiconductor field effect transistor is connected to said first output of said control logic circuit;

an eighth P channel metal oxide semiconductor field effect transistor having a gate, a source, and a drain wherein said gate of said eighth P channel metal oxide semiconductor field effect transistor is connected to said tristate control input of said control logic circuit, said source of said eighth P channel metal oxide semiconductor field effect transistor is connected to said first output of said control logic circuit, and said drain of said eighth P channel metal oxide semiconductor field effect transistor is connected to said second output of said control logic circuit;

a fourth N channel metal oxide semiconductor field effect transistor having a gate, a source, and a drain wherein said gate of said fourth N channel metal oxide semiconductor field effect transistor is connected to said third output of said control logic circuit, said drain of said fourth N channel metal oxide semiconductor field effect transistor is connected to said first output of said control logic circuit, and said source of said fourth N channel metal oxide semiconductor field effect transistor is connected to said second output of said control logic circuit;

a fifth N channel metal oxide semiconductor field effect transistor having a gate, a source, and a drain wherein said gate of said fifth N channel metal oxide semiconductor field effect transistor is connected to said logic control input of said control logic circuit, said drain of said fifth N channel metal oxide semiconductor field effect transistor is connected to said second output of said control logic circuit, and said source of said fifth N channel metal oxide semiconductor field effect transistor is connected to said reference voltage node;

a sixth N channel metal oxide semiconductor field effect transistor having a gate, a source, and a drain wherein said gate of said sixth N channel metal oxide semiconductor field effect transistor is connected to said tristate control input of said control logic circuit, said drain of said sixth N channel metal oxide semiconductor field effect transistor is connected to said second output of said control logic circuit, and said source of said sixth N channel metal oxide semiconductor field effect transistor is connected to said reference voltage node; and an inverter having an input and an output wherein said input of said inverter is connected to said tristate control input of said control logic circuit and said output of said inverter is connected to said third output of said control logic circuit.

11. a voltage pull up circuit, comprising:

a first voltage supply node having a first voltage level;

an output node having an output voltage level;

a reference voltage supply node having a reference voltage level;

a control input node;

means to pull up the voltage at said output node to said first voltage level when the signal at said control input node is a logical one and the voltage at said output node is above a critical voltage.

12. The voltage pull up circuit of claim 11 wherein said means to pull up the voltage at said output node further comprises:

an AND INVERT circuit having a first input, a second input, and an output wherein said first input of said AND INVERT circuit is connected to said output node and said second input of said AND INVERT circuit is connected to said control input node;

a second P channel metal oxide semiconductor field effect transistor having a source, a gate, a drain, and an isolation well wherein said gate of said second P channel metal oxide semiconductor field effect transistor is connected to said output of said AND INVERT circuit and said drain of said second P channel metal oxide semiconductor field effect transistor is connected to said output node;

a third P channel metal oxide semiconductor field effect transistor having a source, a gate, a drain, and an isolation well wherein said drain of said third P channel metal oxide semiconductor metal oxide semiconductor field effect transistor is connected to said source of said second P channel metal oxide semiconductor field effect transistor and said source of said third metal oxide semiconductor field effect transistor is connected to said first voltage supply node;

a fourth P channel metal oxide semiconductor field effect transistor having a source, a gate, a drain, and an isolation well wherein said source of said fourth metal oxide semiconductor field effect transistor is connected to said first voltage supply node, said drain of said fourth P channel metal oxide semiconductor field effect transistor is connected to said isolation well of said second P channel metal oxide semiconductor field effect transistor, and said isolation well of said fourth P channel metal oxide semiconductor field effect transistor is connected to said drain of said third P channel metal oxide semiconductor field effect transistor;

a fifth P channel metal oxide semiconductor field effect transistor having a source, a drain, a gate, and an isolation well wherein said drain of said fifth P channel metal oxide semiconductor field effect transistor is connected to said gate of said third P channel metal oxide semiconductor field effect transistor and the gate of said fourth P channel metal oxide semiconductor field effect transistor, said gate of said fifth P channel metal oxide semiconductor field effect transistor is connected to said control input node, and said source and said isolation well of said fifth P channel metal oxide semiconductor field effect transistor are connected to said output node; and a third N channel metal oxide semiconductor field effect transistor having a source, a drain, a gate, and an isolation well wherein said drain of said third N channel metal oxide semiconductor field effect transistor is connected to said gate of said third P channel metal oxide semiconductor field effect transistor and the gate of said fourth P channel metal oxide semiconductor field effect transistor, said gate of said third N channel metal oxide semiconductor field effect transistor is connected to said control input node, and said source and said isolation well of said third N channel metal oxide semiconductor field effect transistor are connected to said reference voltage node.

13. The voltage pull up circuit of claim 11 wherein said first voltage level is about 3.3 volts.

14. The voltage pull up circuit of claim 11 wherein said output voltage level is between about 0 and 5.0 volts.

15. The voltage pull up circuit of claim 11 wherein said reference voltage level is about zero volts.

16. The voltage pull up circuit of claim 11 wherein said critical voltage is about 2.0 volts.

* * * * *